United States Patent [19]
Tsukagoshi et al.

[11] Patent Number: 6,025,757
[45] Date of Patent: Feb. 15, 2000

[54] PIEZOELECTRIC OSCILLATOR CIRCUIT

[75] Inventors: Kunihiko Tsukagoshi; Satoru Miyabe; Kazuhisa Oyama, all of Tokyo, Japan

[73] Assignee: Nippon Precision Circuits Inc., Tokyo, Japan

[21] Appl. No.: 09/191,836

[22] Filed: Nov. 13, 1998

[30] Foreign Application Priority Data

Nov. 14, 1997 [JP] Japan ................................ 9-313020

[51] Int. Cl.$^7$ .............................. H03B 5/36; H03B 5/04; H03B 5/06
[52] U.S. Cl. ................... 331/158; 331/109; 331/116 FE; 331/176; 331/182; 331/183; 331/185; 331/173
[58] Field of Search .................................. 331/109, 111, 331/116 R, 116 FE, 116 M, 117 R, 117 FE, 117 D, 158, 175, 176, 177 V, 173, 182, 183, 185, 186

[56] References Cited

U.S. PATENT DOCUMENTS

| | | | |
|---|---|---|---|
| 4,128,816 | 12/1978 | Shimotsuma | 331/116 R |
| 4,618,837 | 10/1986 | Matsuura | 331/160 |
| 5,101,178 | 3/1992 | Komoda | 331/158 |
| 5,212,460 | 5/1993 | Tamagawa | 331/116 FE |
| 5,764,112 | 6/1998 | Bal et al. | 331/116 FE |

Primary Examiner—David Mis
Attorney, Agent, or Firm—Amster Rothstein & Ebenstein

[57] ABSTRACT

There is disclosed an oscillator circuit comprising the first load capacitor with one electrode there of being connected with an input side of a CMOS inverter within a quartz oscillator circuit, and the second load capacitor with one electrode there of being connected with the output side of the inverter, wherein the inverter is coupled to a lower potential side via a current-limiting device, and the other electrodes of the first and second load capacitors are coupled to a lower potential side via the above-described current-limiting device. Thus, variations in the power-supply voltages synchronized with oscillation are reduced with realization of lower current consumption.

6 Claims, 9 Drawing Sheets

PIEZOELECTRIC OSCILLATOR CIRCUIT

BACKGROUND OF THE INVENTION

1. Field of the Invention

The present invention relates to an oscillator circuit.

2. Description of Related Art

Heretofore, an oscillator circuit for realizing lower power consumption has been provided with a configuration as shown in FIG. 1. This circuit is described specifically by referring to this figure. A CMOS inverter 101 is connected with a higher-potential power supply 103 and with a lower-potential power supply 104 via a current-limiting device 102 that is used to realize lower power consumption. One electrode of a load capacitor 105 is connected with the input side of the CMOS inverter 101, while the other electrode is connected with the lower-potential power supply 104. One electrode of a load capacitor 106 is connected with the output side of the CMOS inverter 101, whereas the other electrode is connected with the lower-potential power supply 104. Also shown are a quartz oscillator 107 and a feedback resistor 108.

In the above-described configuration, however, what the load capacitors 105 and 106 are directly connected with the power supplies cause the circuit to have the problem that the power-supply voltages vary greatly in synchronism with the oscillation. Therefore, any circuit using a power supply in common with this oscillator circuit has the disadvantage of becoming unstable in operation. Conversely, where the power-supply voltages are varied by some action independent of the oscillation, there is also the advantage that the variations adversely affect the oscillator circuit.

SUMMARY OF THE INVENTION

The present invention provides an oscillator circuit having a first load capacitor with one electrode connected with the input side of a CMOS inverter and a second load capacitor with one electrode connected with the output side of the CMOS inverter, in which oscillator circuit the CMOS inverter is coupled to one power-supply potential via a current-limiting device, and both of the other electrodes of the first and second load capacitors are coupled to the one power-supply potential via the current-limiting device. Consequently, variations in the power-supply voltages in synchronism with oscillation can be reduced.

The current-limiting device may be made to have a plurality of switching devices connected in parallel so that these switching devices are controlled by a control circuit according to the output from the CMOS inverter. In this case, the current-limiting device is enable to be adjusted, so that optimum adjustment becomes possible. Moreover, for example, by controlling the switching devices so that a large amount of current flows via these switching devices at the start of oscillation and so that a desired amount of current flows after the oscillation has been stabilized, the time between the start of the oscillation and the stabilization of the oscillation can be shortened to enhance the responsiveness.

The current-limiting device may be a resistor, a transistor, or a constant current circuit.

DESCRIPTION OF THE PREFERRED EMBODIMENTS

The present invention will be specifically described in the following according to embodiments shown in the figures.

An oscillator circuit according to the present comprises a CMOS inverter, a piezoelectric device and a feedback resistor each connected between input and output terminals of the CMOS inverter, a first load capacitor connected with the input side of the CMOS inverter with one electrode, and a load capacitor connected with the output side of the CMOS inverter with one electrode, wherein the CMOS inverter is coupled to one power-supply potential via a current-limiting device and both of the other electrodes of the first and second load capacitor are coupled to the one power-supply potential via the current-limiting device.

In the embodiments, the current-limiting device is a resistor, a transistor, a constant current circuit, or a plurality of switching devices connected in parallel and controlled by a control circuit further provided for controlling the switching devices according to the output from the CMOS inverter. The switching devices are transistors.

First Embodiment

Figure 2:
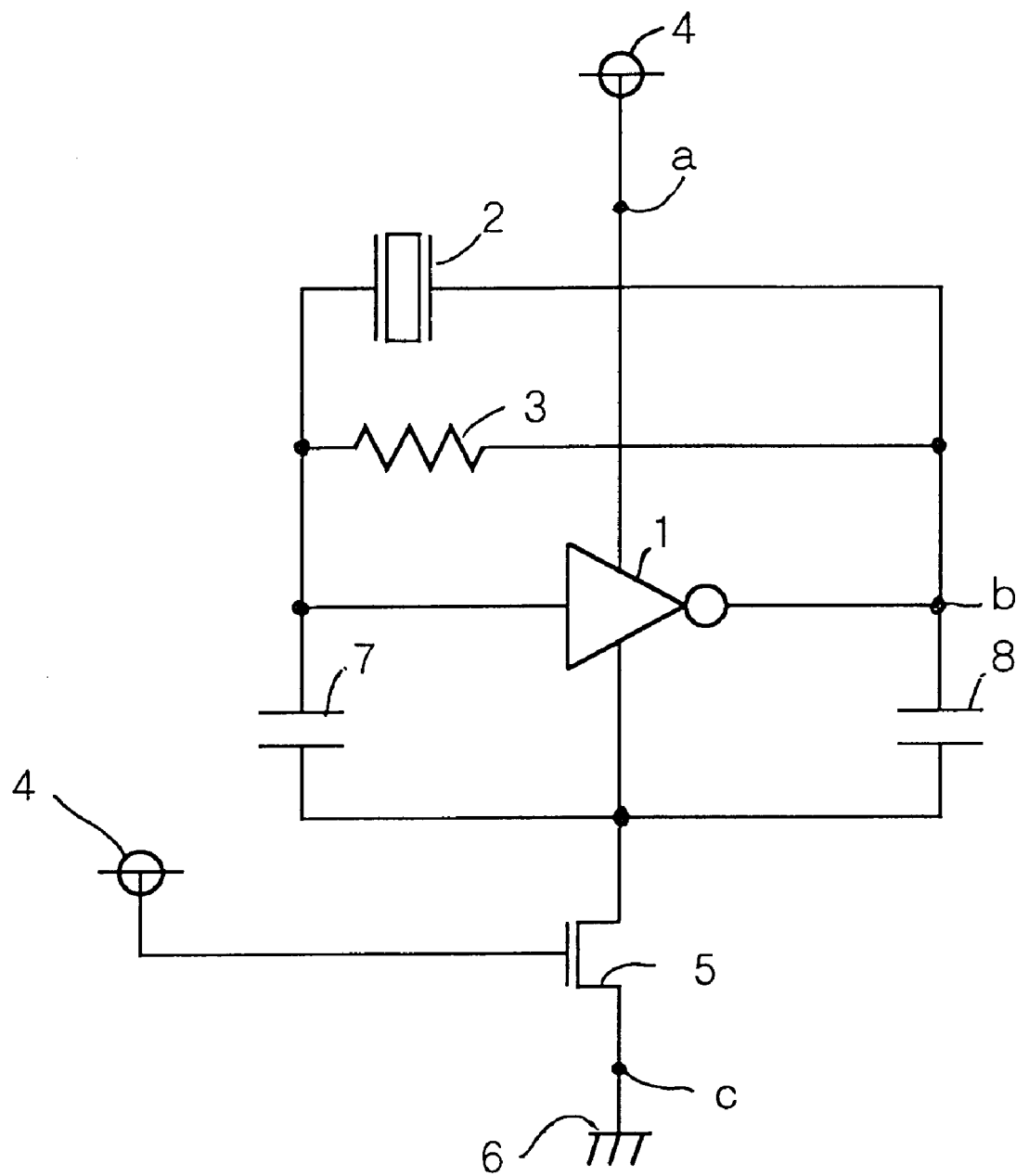
FIG. 2 is a circuit diagram showing an embodiment of the present invention.

Referring to FIG. 2, there are shown a CMOS inverter 1, a quartz oscillator 2 forming a piezoelectric device, and a feedback resistor 3. The quartz oscillator 2 and feedback resistor 3 are connected between the input and output terminals of the CMOS inverter 1. One power-supply terminal of the CMOS inverter 1 is connected with the higher potential side 4. The other power-supply terminal is connected with the lower potential side 6 of the power supply via an N-channel MOS transistor 5 forming a current-limiting device. The gate of the transistor 5 is connected with the higher potential side 4 of the power supply. The transistor 5 forms a current-limiting device. The first load capacitor 7 is connected with the input side of the CMOS inverter 1 with one electrode and is coupled to the lower potential side 6 with the other electrode via the transistor 5. The second load capacitor 8 is connected with the output side of the CMOS inverter 1 with one electrode, and is coupled to the lower potential side 6 with the other electrode via the transistor 5 in the same way as the load capacitor 7.

Figure 1:
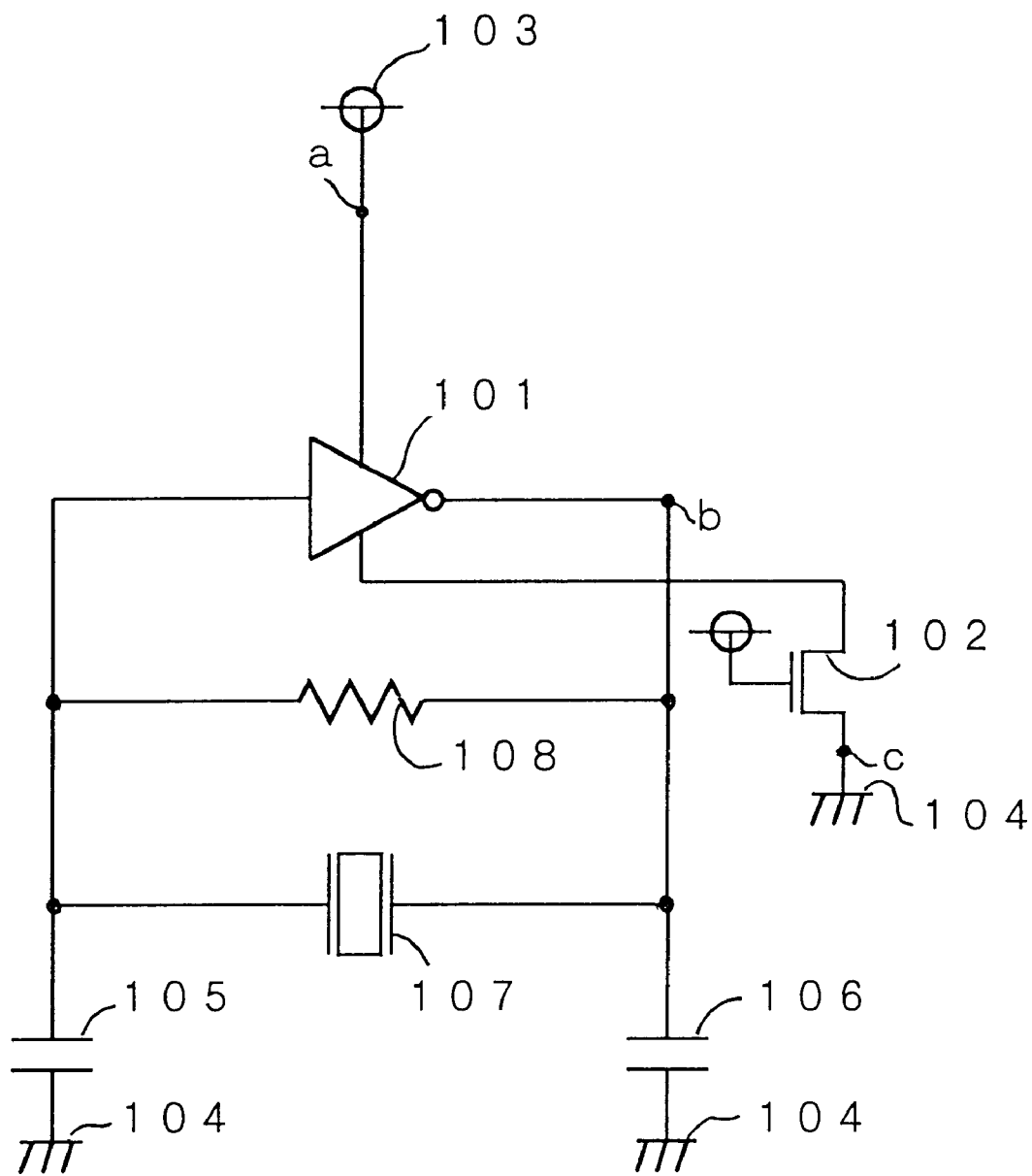
FIG. 1 is a circuit diagram illustrating a configuration of the prior art oscillator circuit.
Figure 3:
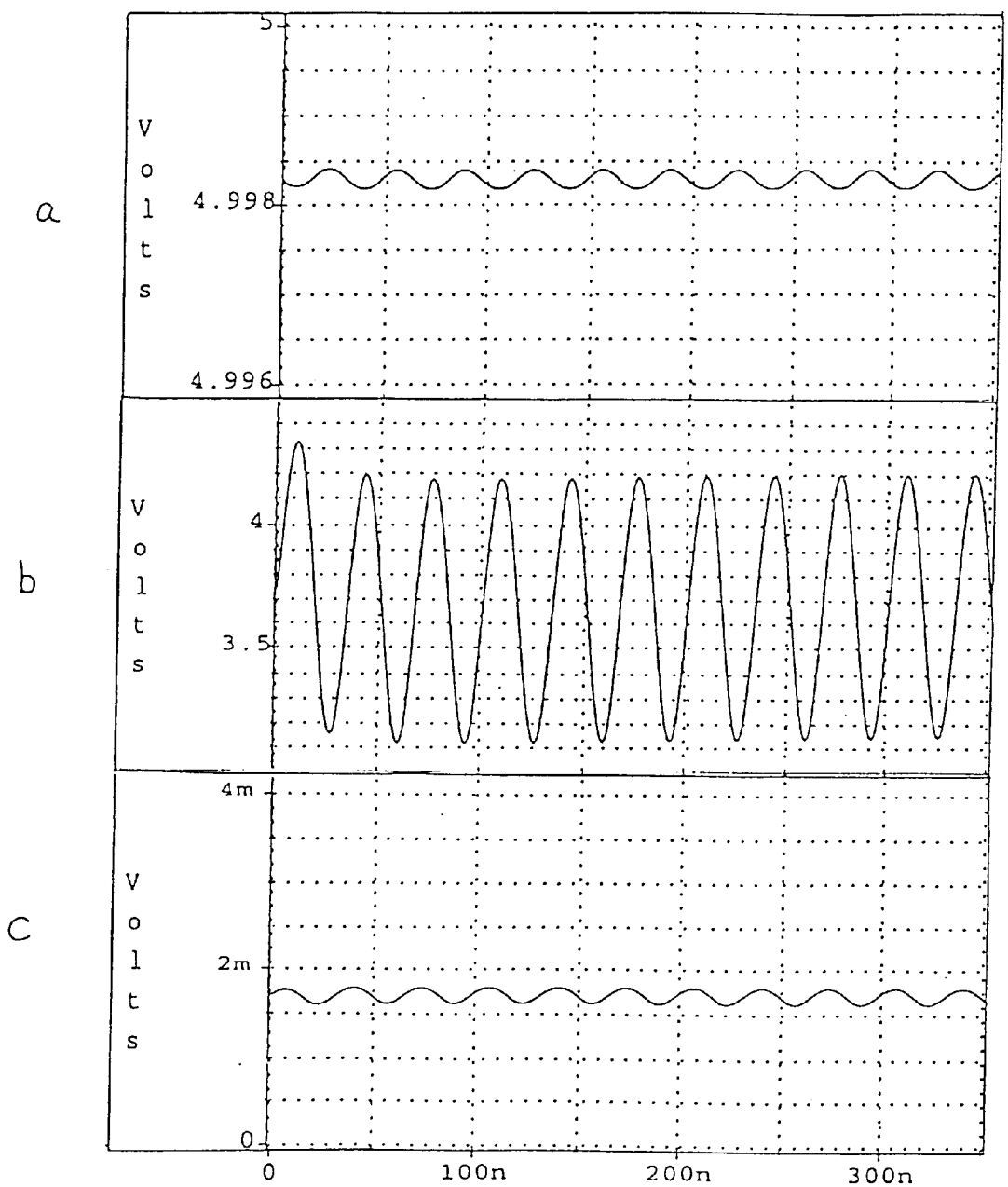
FIG. 3 is a diagram illustrating simulated voltage waveforms when the circuit shown in FIG. 2 is operated.
Figure 4:
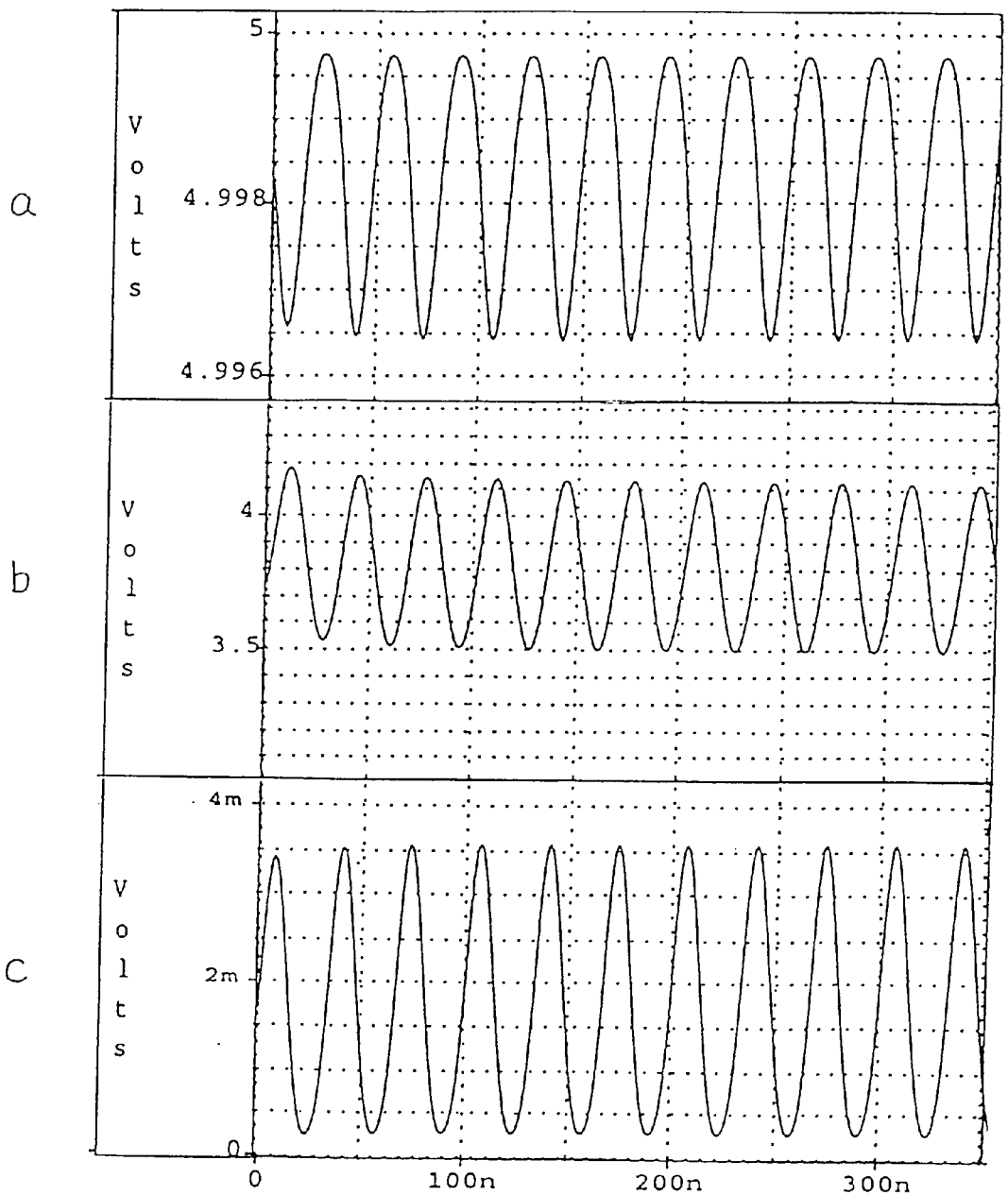
FIG. 4 is a diagram illustrating simulated voltage waveforms when a circuit shown in FIG. 1 is operated.

FIG. 3 is a diagram of the simulated waveforms of the voltages where the circuit with the configuration shown in FIG. 2 is oscillated at 30 MHz. In this figure, waveforms indicated with alphabetical characters a to c are those of the voltages at the terminals a to c shown in FIG. 2, respectively FIG. 4 shows comparative examples of waveforms with those of FIG. 3, which are the simulated waveforms of the voltages where the circuit with the prior art configuration shown in FIG. 1 is oscillate similarly to the case in FIG. 3 (30 MHz). In this figure, waveforms indicated with alphabetical characters a to c are those of the voltages at terminals a to c shown in FIG. 1, respectively.

As is apparent from the comparison of FIGS. 3 and 4, where the outputs from the CMOS inverter 1 and 101 (waveforms b) are kept in substantially equal level, the magnitude of swings of the power-supply voltages (waveforms a, c) becomes smaller in the case of FIG. 3.

More specifically, the waveform ( on the higher potential side of the power supply) in the conventional case shown in FIG. 4 shows that the maximum value of the magnitude of the swing is 0.00325 V. Compared with this, the waveform a (on the higher potential side of the power supply) in the embodiment shown in FIG. 3 shows that the maximum value of the magnitude of the swing is reduced to 0.00025 V. In addition, the waveform c (on the lower potential side of the power supply) in the conventional case shown in FIG. 4 shows that the magnitude of the swing is 3.3 mV at maximum, whereas the waveform c (on the lower potential side of the power supply) in the present embodiment shown in FIG. 3 shows that the maximum value of the magnitude of the swing is reduced to 0.25 mV.

In this way, since the load capacitors 7 and 8 are coupled to one power-supply potential only via the transistor 5, that is, the load capacitors are not directly coupled to the power-supply voltages, variations in the power-supply voltages synchronized with the oscillation can be reduced. In addition, when the load capacitors 7 and 8 are connected with the power-supply potential 6, the connections are made only via the current-limiting device without interposing any additional capacitive element. Therefore, influence of noises produced from the power supply side can be reduced.

In the above embodiment, the load capacitors 7 and 8 are connected with the lower potential side 6 via the transistor 5. However, they may also be connected with the higher potential side 4 of the power supply via current-limiting means such as a transistor.

In the above embodiment, a transistor is used as the current-limiting device. The invention, however, is not limited to this. Similar advantages can be obtained by using a resistor, a constant current circuit, or the like.

Second Embodiment

Figure 5:
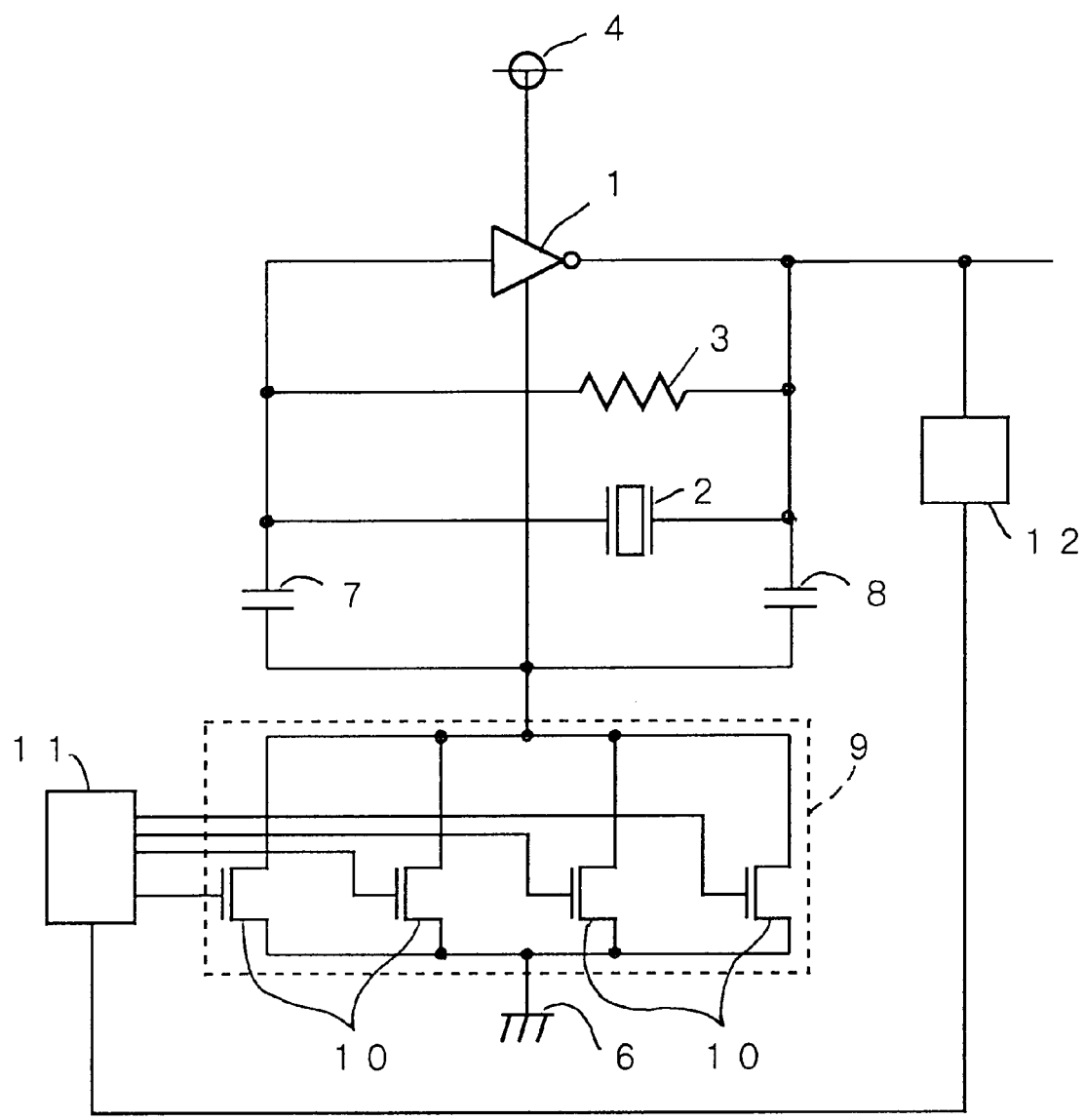
FIG. 5 is a circuit diagram showing another embodiment of the invention.

Another embodiment is next described by referring to FIG. 5, where the current-limiting device consists of a plurality of switching devices connected in parallel and controlled according to the output from the CMOS inverter 1.

In FIG. 5, a current-limiting device 9 consists of a plurality of transistors 10 connected in parallel. Each of these transistors 10 is formed as a switching device. A control circuit 11 turns on and off the transistors 10 according to the output from the CMOS inverter 1 detected by a later described detection circuit 12. The detection circuit 12 detects the amplitude of the output generated by the CMOS inverter 1 and produces outputs with a different values depending on whether the amplitude exceeding a prescribed value is obtained or not.

In the configuration described above, the current supplied to the CMOS inverter 1 can be appropriately adjusted according to the number of the transistors 10 that are turned on to enable optimum adjustment of the current. For example, when the amplitude of the oscillating output from the CMOS inverter 1 is small at the start of the oscillation, all of these transistors 10 can be turned on to supply a large amount of current into the oscillator circuit. When the detection circuit 12 detects that the oscillation has destabilized and a certain magnitude of amplitude is maintained, turning on and off of the transistors 10 are set in a given condition so as to supply a given amount of current. Thus, the time required from the start of the oscillation to the stabilization of the oscillation can be shortened to enhance responsiveness.

In the above embodiment, a plurality of transistors connected in parallel are used as switching devices forming the current-limiting device. The invention, however, is not limited to this. For instance, a plurality of constant current circuits each comprising a plurality of transistors may be used in parallel connection. In this case, by controlling the gate voltage of the transistors forming the constant current circuits with the control circuit 11, advantages similar to those in the foregoing can be derived. Where the current is limited by a plurality of resistors connected in parallel, by providing switching devices each connected in series with each of the resistors, and by controlling turning on and off of these switching devices with the control circuit 11, advantages similar to the foregoing can be obtained.

In the above embodiment, a plurality of switching devices are connected in parallel so as to be appropriately controlled according to the output from the detection circuit 12. However, similar advantages can be obtained by using one current-limiting device and continuously varying the gate voltage value, for example, of this single device according to the output from the detection circuit 12.

Figure 6:
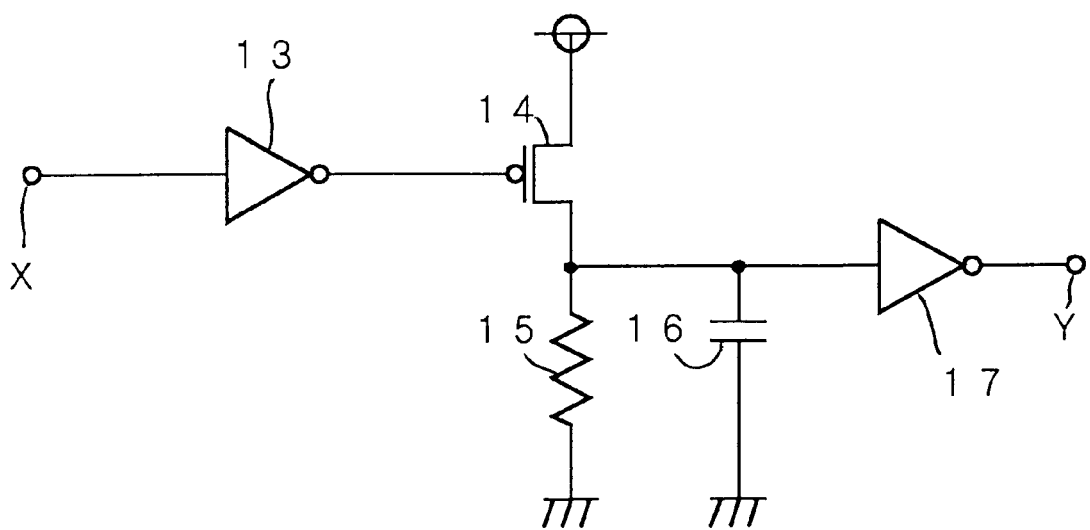
FIG. 6 is a circuit diagram showing an example of a detection circuit in the embodiment of FIG. 5.

As the detection circuit 12, that shown in FIG. 6 may be used. In FIG. 6, the output from the CMOS inverter 1 is inputted at a terminal X and the detection signal from the detection circuit is outputted to the control circuit 11 through a terminal Y. Specifically, the detected voltage level is established by varying the inverted potential (threshold value) from an inverter 13. Since the detailed description on the operation is presented in Unexamined Published Japanese Patent No. 7-193428, the detailed description of the operation is omitted herein. Also shown in this figure are a P-channel MOS transistor 14, a resistor 15, a capacitor 16, and an inverter 17.

In FIG. 6, when the oscillating output voltage from the CMOS inverter 1 is inputted from the terminal X with a large amplitude, the time during which a current flows through the inverter 13 is short. However, when the oscillating output voltage from the CMOS inverter 1 is inputted from the terminal X with a small amplitude, the time during which a current flows through the inverter 13 becomes long. This causes problems where the design demands lower power consumption.

Generally, the threshold value of the inverter 13 is determined by the size of the transistors forming the inverter, so that, when the threshold value is changed, it is necessary to change the size of the transistors.

Figure 7A:
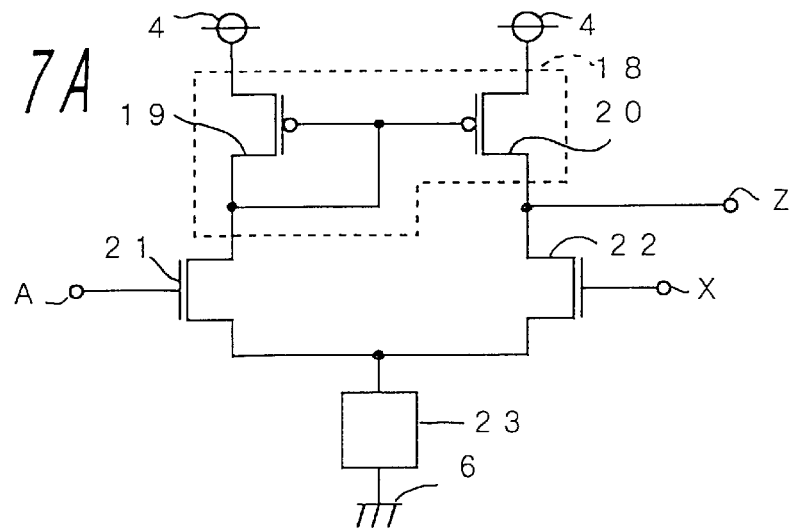
FIG. 7A is a circuit diagram showing an example of a differential amplifier circuit as a main part of another example of the detection circuit in the embodiment of FIG. 5.
Figure 7B:
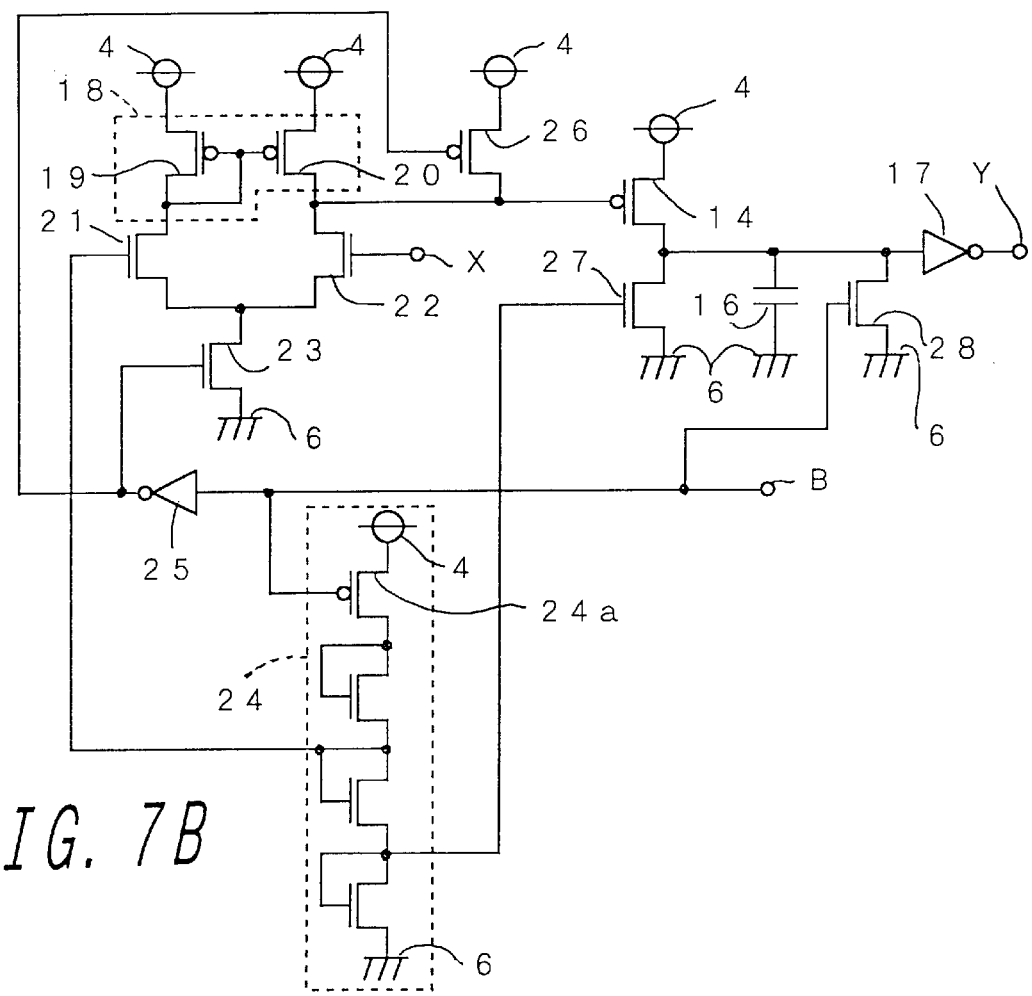
FIG. 7B is a circuit diagram showing another example of the detection circuit in the embodiment of FIG. 5 using the differential amplifier circuit of FIG. 7A.

FIG. 7A and 7B show an embodiment free of the above-described problem with the inverter 13 of FIG. 6. A differential amplifier circuit is used instead of the inverter 13 and current-limiting means are connected with the differential amplifier circuit. That is, the oscillating output is applied to one input of the differential amplifier circuit and a comparison reference voltage for judging the output level is applied to the other input. A connection with the power supply is made via the current-limiting means. Consequently, different oscillating output levels can be detected with the same configuration. Furthermore, the amount of consumed current can be reduced.

FIG. 7A shows an example of a differential amplifier circuit used instead of the inverter 13 shown in FIG. 6.

In FIG. 7A, a current mirror circuit 18 consists of a pair of P-channel MOS transistors 19, 20. The sources of the transistors 19 and 20 are connected with higher potential sides 4. The drain of the transistor 19 is connected with the gates of the transistors 19 and 20 and with the drain of the N-channel MOS transistor 21. A comparison reference voltage used to establish a threshold value for judging a level of a voltage applied via a terminal A is applied to the gate of the transistor 21. The source of the transistor 21 is connected with the source of the N-channel MOS transistor 22 and with a lower potential side 6 via a current-limiting means 23 comprising a transistor or the like. The drain of the transistor 22 is connected with the drain of the transistor 20 and with the gate of the transistor 14 shown in FIG. 6 via a terminal Z. The gate of the transistor 22 receives the output from the CMOS inverter 1 from a terminal X.

The operation of FIG. 7A is described briefly. When the comparison reference voltage supplied to the gate of the transistor 21 is applied via the terminal A, a threshold value is established according to the applied voltage and compared with the voltage level of the oscillating output applied via the terminal X.

When the oscillating output voltage exceeds the threshold value, the voltage at the terminal Z drops. When the voltage level of the oscillating output applied via the terminal X does not exceed the threshold value, the terminal Z is maintained at a high potential.

Consequently, where the inverter 13 in the detection circuit shown in FIG. 6 is replaced by the differential amplifier circuit shown in FIG. 7A, when the voltage level of the oscillating output applied via the terminal X exceeds the threshold value repeatedly, the capacitor 16 is gradually charged to make the output of the inverter 17 be inverted and produce a detection output "0". Conversely, when the voltage level of the oscillating output applied via the terminal X does not exceed the threshold value, the terminal Z is kept at a high potential to turn off the transistor 14 and the capacitor 16 is not charged. Therefore, the inverter 17 does not produce detection output "0".

FIG. 7B shows another example of the detection circuit 16 using the differential amplifier circuit shown in FIG. 7A. In this example, the current flowing through the differential amplifier circuit shown in FIG. 7A is controlled by the signal applied to the terminal B, thus turning on and off of the differential amplifier circuit is controlled. Also, the discharging of electric charge in the capacitor 16 is controlled. Note that in this figure, the same reference numerals as in the previous figure indicate the same components.

In this figure, a voltage source 24 outputs a comparison reference voltage to the gate of the transistor 21. Also shown are an inverter 25, a P-channel MOS transistor 26, and N-channel MOS transistors 27, 28.

The operation is described briefly. In a standby condition, signal "1" is applied to the terminal B, thus turning off a P-channel MOS transistor 24a in the voltage source 24. At the same time, the transistor 28 is turned on and discharges the capacitor 16 to bring it in the initial state. Therefore, at this time, i.e., in a standby condition, the input to the inverter 17 is "0" and "1" is produced at the output terminal Y. The inverted output "0" from the inverter 25 turns off the transistor 23, stopping the supply of current into the differential amplifier circuit shown in FIG. 7A. Therefore, in a standby condition, useless current does not flow into the circuit shown in FIG. 7A. This allows lower current consumption. Inverted output "0" from the inverter 25 turns on the transistor 26. Concomitantly, the transistor 14 is turned off. Since the voltage source 24 has been turned off, the transistor 27 is also turned off. Consequently, the capacitor 16 is prevented from being charged. Accordingly, the drawback of uselessly charting the capacitor 16 in a standby condition, can be eliminated. Hence, lower power consumption is accomplished.

Figure 8:
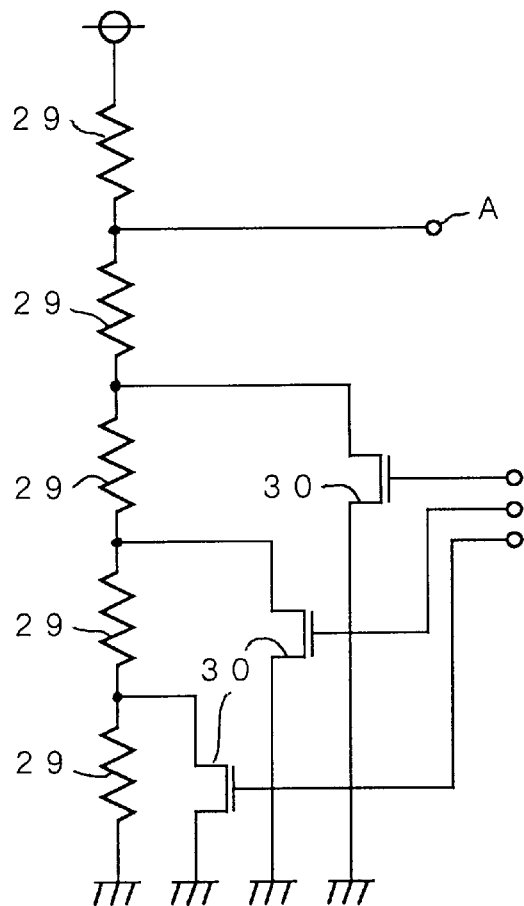
FIG. 8 is a circuit diagram showing another example of the voltage source in the detection circuit of FIG. 7B.
Figure 9:
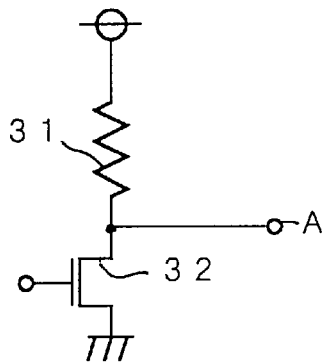
FIG. 9 is a circuit diagram showing a further example of the voltage source in the detection circuit of FIG. 7B.

When the circuit becomes in operation and signal "0" is inputted to the terminal B, the transistor 28 is turned off, stopping the capacitor 16 from being in the initial state. The voltage source 24 is turned on, and the comparison reference voltage is outputted to the gate of the transistor 21. At the same time, the transistor 27 is turned on. Inverted output "1" from the inverter 25 operates the transistor 23 and turns off the transistor 26. This permits the circuit shown in FIG. 7A to operate. Under this condition, if the output from the CMOS inverter 1 is applied from the terminal X, the same operation as the foregoing is performed.

Where the differential amplifier circuit shown in FIG. 7A is adopted, the threshold value can be easily varied by changing the comparison reference voltage applied to the gate of the transistor 21. Furthermore, the comparison reference voltage can be adjusted by the signal from other circuit block of the IC. In addition, the voltage may be adjusted by directly applying a voltage from the outside of the IC. For example, a plurality of resistors 29 may be connected in series across power supplies as shown in FIG. 8 with one terminal of the junctions of the resistors 29 being connected with the gate of the transistor 21 shown in FIGS. 7A and 7B, the other junctions being connected with the power supply via transistors 30, and the gates of the transistors 30 being controlled by binary signals from other circuit block in the IC or binary signals from the outside of the IC, thereby making digital adjustment. Alternatively, as shown in FIG. 9 a resistor 31 and a transistor 32 may be connected across power supplies with the junction being connected with the gate of the transistor 21 shown in FIG. 7A and 7B, and the gate of the transistor 32 being controlled by an analog signal from other circuit block within the IC or an analog signal from the outside of the IC, thereby adjusting the comparison reference voltage may be adjusted in an analog manner.

Figure 10A:
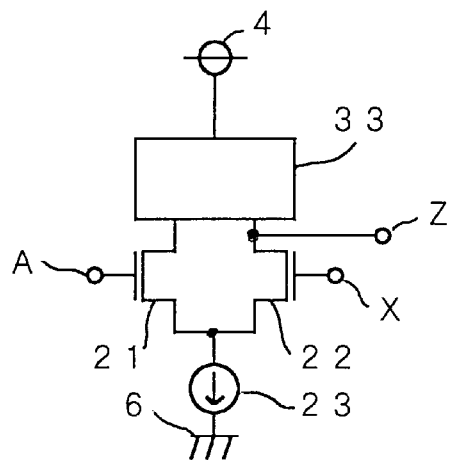
FIGS. 10A to 10C are circuit diagrams of other examples of differential amplifier circuits in the detection circuit of FIG. 7B.
Figure 10B:
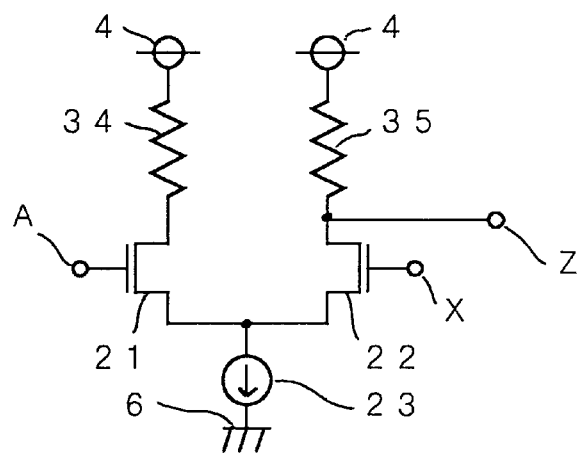
Figure 10C:
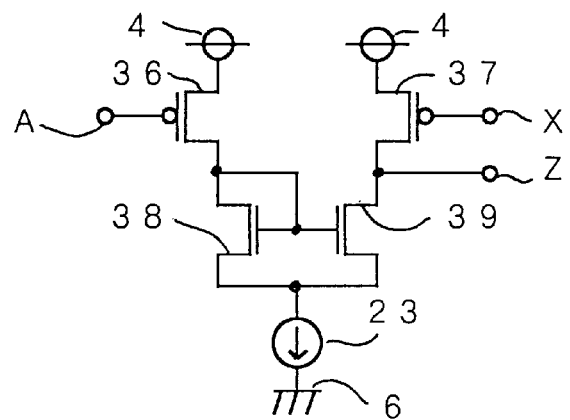

In the above-described embodiment, the circuit shown in FIG. 7A is used as the differential amplifier circuit. However, the differential amplifier circuit is not limited to this type. For example, those shown in FIGS. 10A, 10B and 10C may be used. Shown in these figures are an active load 33, resistors 34 and 35, P-channel MOS transistors 36 and 37, N-channel MOS transistors 38 and 39. Note that the same components as those in the previous and this figures are indicated by the same reference numerals.

In the above description, the load capacitors 7 and 8 are provided so as to be connected with the lower potential side 6 via the switching device. Alternatively, they may be connected with the higher potential side 4 of the power supply via a switching device.

According to the present invention, variations in the power-supply voltages synchronized with oscillation can be reduced while accomplishing lower power consumption.

The current-limiting device may be a plurality of switching devices connected in parallel which are controlled by the control circuit according to the output from the CMOS inverter. In this case, the current in the current-limiting device can be adjusted to enable optimum current adjustment. In addition, for example, by controlling the switching devices so that a large amount of current flows via these switching devices at the start of oscillation and so that a given amount of current flows after the oscillation has been stabilized, the time required from the start of the oscillation to the stabilization of the oscillation can be shortened to improve, the responsiveness.

What is claimed is:

1. In an oscillator circuit comprising a CMOS inverter having input and output terminals, a piezoelectric device and a feedback resistor each connected between the input and output terminals of said CMOS inverter, a first load capacitor connected with an input side of said CMOS inverter with one electrode, and a second load capacitor connected with an output side of said CMOS inverter with one electrode, the improvement wherein said CMOS inverter is coupled to one power-supply potential via a current-limiting device, and wherein both of the other electrodes of said first and second load capacitors are coupled to said one power-supply potential via said current-limiting device.

2. The oscillator circuit of claim 1, wherein said current-limiting device is a resistor.

3. The oscillator circuit of claim 1, the wherein said current-limiting device is a transistor.

4. The oscillator circuit of claim 1, the wherein said current-limiting device is a constant current regulator circuit.

5. The oscillator circuit of claim 1, the wherein said current-limiting device has a plurality of switching devices connected in parallel, and wherein said oscillator circuit further comprises a control circuit for controlling said switching devices according to an output from said CMOS inverter.

6. The oscillator circuit of claim 5, the wherein said switching device is a transistor.

* * * * *